United States Patent
Jiang et al.

(10) Patent No.: US 12,054,827 B2
(45) Date of Patent: Aug. 6, 2024

(54) FLOWABLE FILM CURING USING H2 PLASMA

(71) Applicant: Applied Materials, Inc., Santa Clara, CA (US)

(72) Inventors: Shishi Jiang, Santa Clara, CA (US); Pramit Manna, Santa Clara, CA (US); Abhijit Basu Mallick, Fremont, CA (US); Suresh Chand Seth, Mumbai (IN); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 104 days.

(21) Appl. No.: 17/041,403

(22) PCT Filed: Apr. 1, 2019

(86) PCT No.: PCT/US2019/025227
§ 371 (c)(1),
(2) Date: Sep. 24, 2020

(87) PCT Pub. No.: WO2019/195188
PCT Pub. Date: Oct. 10, 2019

(65) Prior Publication Data
US 2021/0025058 A1    Jan. 28, 2021

(30) Foreign Application Priority Data
Apr. 3, 2018 (IN) .............................. 201841012612

(51) Int. Cl.
C23C 16/505 (2006.01)
C23C 16/24 (2006.01)
(Continued)

(52) U.S. Cl.
CPC ............ C23C 16/505 (2013.01); C23C 16/24 (2013.01); C23C 16/56 (2013.01);
(Continued)

(58) Field of Classification Search
None
See application file for complete search history.

(56) References Cited

U.S. PATENT DOCUMENTS 9,029,272 B1 * 5/2015 Nakano ............... H01L 21/0234
                                                                   438/424
9,130,014 B2    9/2015 Lin et al.
(Continued)

FOREIGN PATENT DOCUMENTS

CN      1129492 A      8/1996
CN    106133884 A     11/2016
(Continued)

OTHER PUBLICATIONS

International Search Report and Written Opinion dated Jul. 18, 2019 for Application No. PCT/US2019/025227.
(Continued)

Primary Examiner — Jose I Hernandez-Kenney
(74) Attorney, Agent, or Firm — Patterson + Sheridan, LLP

(57) ABSTRACT

Embodiments herein provide methods of plasma treating an amorphous silicon layer deposited using a flowable chemical vapor deposition (FCVD) process. In one embodiment, a method of processing a substrate includes plasma treating an amorphous silicon layer by flowing a substantially silicon-free hydrogen treatment gas into a processing volume of a processing chamber, the processing volume having the substrate disposed on a substrate support therein, forming a treatment plasma of the substantially silicon-free hydrogen treatment gas, and exposing the substrate having the amor-
(Continued)

phous silicon layer deposited on a surface thereof to the treatment plasma. Herein, the amorphous silicon layer is deposited using an FCVD process. The FCVD process includes positioning the substrate on the substrate support, flowing a processing gas into the processing volume, forming a deposition plasma of the processing gas, exposing the surface of the substrate to the deposition plasma, and depositing the amorphous silicon layer on the surface of the substrate.

19 Claims, 2 Drawing Sheets

(51) Int. Cl.
*C23C 16/56* (2006.01)
*H01J 37/32* (2006.01)
*H01L 21/3205* (2006.01)
*H01L 21/321* (2006.01)

(52) U.S. Cl.
CPC .... *H01J 37/32091* (2013.01); *H01J 37/3244* (2013.01); *H01J 37/32724* (2013.01); *H01L 21/32055* (2013.01); *H01L 21/321* (2013.01); *H01J 2237/3321* (2013.01)

(56) References Cited

U.S. PATENT DOCUMENTS

| | | | |
|---|---|---|---|
| 2007/0299239 A1* | 12/2007 | Weigel | H01L 21/02274 257/E21.273 |
| 2009/0142878 A1 | 6/2009 | Choi et al. | |
| 2012/0202315 A1* | 8/2012 | Whitesell, III | H01L 31/202 257/E31.004 |
| 2013/0143378 A1 | 6/2013 | Park et al. | |
| 2014/0335680 A1 | 11/2014 | Wang et al. | |
| 2014/0357065 A1 | 12/2014 | Wang et al. | |
| 2015/0118864 A1 | 4/2015 | Nakano et al. | |
| 2016/0314961 A1 | 10/2016 | Liu et al. | |
| 2017/0372919 A1* | 12/2017 | Manna | H01L 21/02211 |

FOREIGN PATENT DOCUMENTS

| | | | |
|---|---|---|---|
| CN | 106373908 A * | 2/2017 | ....... H01L 21/02274 |
| KR | 20080000538 A | 1/2008 | |
| KR | 10-2014-0009170 A | 1/2014 | |
| KR | 10-2017-0101997 A | 9/2017 | |

OTHER PUBLICATIONS

Japanese Office Action dated Apr. 11, 2023 for Application No. 2020-553607.
Japanese Office Action dated Sep. 12, 2023 for Application No. 2020-553607.
G. Dupont et al., Structural Properties of N-rich a-Si-N:H films with a low electron-trapping rate, J.Phys.D: Appl. Phys. 30 (1997), pp. 1064-1076.
Chinese Office Action dated Nov. 8, 2023 for Application No. 201980035901.5.
Korean Office Action dated Oct. 23, 2023 for Application No. 10-2020-7031432.
Chinese Office Action and Search Report dated May 17, 2024 for Application No. 201980035901.5, 13 pages.

* cited by examiner

FLOWABLE FILM CURING USING H2 PLASMA

This application is a National Phase Application under 35 U.S.C. 371 of International Application No. PCT/US2019/025227, filed Apr. 1, 2019, which claims priority to Indian Provisional Patent Application No. 201841012612, filed Apr. 3, 2018, each of which is incorporated by reference in their entireties.

BACKGROUND

Field

Embodiments described herein generally relate to the field of semiconductor device manufacturing, and more particularly, to methods of in-situ plasma treating an amorphous silicon layer deposited using a flowable chemical vapor deposition (FCVD) process.

Description of the Related Art

Embodiments described herein generally relate to the field of semiconductor device manufacturing, and more particularly, to methods of in-situ plasma treating an amorphous silicon layer deposited using a flowable chemical vapor deposition (FCVD) process.

Amorphous silicon (a-Si) is widely used in semiconductor device manufacturing including as a sacrificial material, for example as a dummy gate material, or as a trench fill material, for example as a trench capacitor material. Conventionally deposited a-Si is generally conformal, which means it generally has a uniform deposition thickness over features on a substrate surface or on surfaces of openings formed therein. The conformal nature of conventionally deposited a-Si can result in the undesirable formation of seams or voids in features formed thereof. For example, seams may form where layers of a-Si deposited on more than one vertical surface of an opening meet in the center of the opening, such as during the formation of a dummy gate. These undesirable seams may open during subsequent substrate processing and cause the structural failure of the a-Si features. In another example, voids may form in high aspect ratio trenches when conventionally deposited conformal a-Si pinches off the openings thereinto before the a-Si material fully fills the trench. Like seams, voids can be exposed during subsequent substrate processing and, or, can negatively affect device performance or device functionality.

FCVD a-Si deposition processes are advantageous over conventional a-Si deposition processes in applications where seamless and void free features are desired. Unfortunately, a-Si deposited using FCVD processes, hereafter flowable a-Si, is undesirably less dense and physically softer than conventionally deposited a-Si and therefore requires further processing, (e.g., curing) to densify and increase the hardness of the film. Conventional curing methods, such as UV curing, require one or more processing chambers in addition to the FCVD processing chamber used to deposit the FCVD a-Si layer due to different processing temperature requirements and the wafer transition and temperature stabilization requirements between deposition and curing, and are thus time consuming and equipment intensive. Further, UV curing can result in substantial shrinkage of flowable a-Si films, such as up to 70% shrinkage by volume of the as deposited volume, which is particularly undesirable in gap fill applications where shrinkage of the a-Si fill material will result in undesirable voids in features formed thereof.

Accordingly, what is needed in the art are improved methods of curing a-Si layers deposited using an FCVD process.

SUMMARY

Embodiments described herein generally relate to the field of semiconductor device manufacturing, and more particularly, to methods of plasma treating amorphous silicon (a-Si) layers deposited using a flowable chemical vapor deposition (FCVD) process, hereafter flowable a-Si layers.

In one embodiment, a method of processing a substrate includes plasma treating an amorphous silicon layer. Plasma treating the amorphous silicon layer includes flowing a substantially silicon-free hydrogen treatment gas into a processing volume of a processing chamber, the processing volume having the substrate disposed on a substrate support therein, forming a treatment plasma of the substantially silicon-free hydrogen treatment gas, and exposing the substrate having the amorphous silicon layer deposited on a surface thereof to the treatment plasma. Herein, the amorphous silicon layer is deposited using an FCVD process. The FCVD process includes positioning the substrate on the substrate support, flowing a processing gas into the processing volume, forming a deposition plasma of the processing gas, exposing the surface of the substrate to the deposition plasma, and depositing the amorphous silicon layer on the surface of the substrate.

In another embodiment, a method of processing a substrate includes maintaining the substrate at a temperature between about $-100°$ C. and about $100°$ C., depositing an amorphous silicon layer, and plasma treating the amorphous silicon layer. Depositing the amorphous silicon layer includes positioning the substrate on a substrate support disposed in a processing volume, flowing a processing gas into the processing volume, forming a deposition plasma of the processing gas by capacitively coupling the processing gas with an electrode at an RF or other ac frequency power of less than about 300 W, exposing the surface of the substrate to the deposition plasma, and depositing the amorphous silicon layer on a surface of the substrate. Herein, the processing gas is substantially oxygen-free and substantially nitrogen-free. Plasma treating the amorphous silicon layer includes flowing a treatment gas into the processing volume, forming a treatment plasma of the treatment gas by capacitively coupling the processing gas with an electrode at an RF or other ac frequency power between about 100 W and about 500 W, and exposing the amorphous silicon layer to the treatment plasma for a duration of more than about 10 seconds. Herein the treatment gas comprises $H_2$ and an inert gas in a ratio between about 1:10 and about 5:1 and the treatment gas is substantially silicon-free and substantially oxygen-free.

In another embodiment, a method of processing a substrate includes maintaining the substrate at a temperature between about $-100°$ C. and about $100°$ C., depositing an amorphous silicon layer, purging processing gas from the processing volume, and plasma treating the amorphous silicon layer. Depositing an amorphous silicon layer includes positioning a substrate on a substrate support disposed in a processing volume, flowing a processing gas into the processing volume, where the processing gas is substantially oxygen-free and substantially nitrogen-free, forming a deposition plasma of the processing gas by capacitively coupling the processing gas with an electrode at an RF or other ac frequency power of less than about 300 W, exposing the surface of the substrate to the deposition plasma, and depositing the amorphous silicon layer on a surface of the substrate. Purging the processing volume includes stopping the flow of the processing gas, extinguishing the deposition plasma, flowing a purge gas into the processing volume, and evacuating the purge gas from the processing volume before plasma treating the amorphous silicon layer. Plasma treating the amorphous silicon layer includes flowing a treatment gas into the processing volume, where the treatment gas comprises $H_2$ and an inert gas in a ratio between about 1:10 and about 5:1, and where the treatment gas is substantially silicon-free and substantially oxygen-free, forming a treatment plasma of the treatment gas by capacitively coupling an electrode at an RF of other ac frequency power between about 100 W and about 500 W, and exposing the amorphous silicon layer to the treatment plasma for a duration of more than about 10 seconds.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to the field of semiconductor device manufacturing, and more particularly, to methods of plasma treating amorphous silicon (a-Si) layers deposited using a flowable chemical vapor deposition (FCVD) process, hereafter flowable a-Si layers.

Depositing a-Si using an FCVD process advantageously provides seam free formation of features and void free filling of high aspect ratio openings. However, a-Si deposited using an FCVD process typically comprises a high hydrogen content, such as more than about 30 at. %, which undesirably results in lower film density and film quality when compared to conventionally deposited a-Si films having a lower hydrogen content. Therefore, methods herein provide for plasma treating flowable a-Si layers by exposure thereof to an in-situ plasma in the same processing chamber used to deposit the flowable a-Si layer. The plasma treatment herein reduces the hydrogen content of the flowable a-Si films by breaking Si—H bonds thereof to enabling Si with dangling bonds to form Si—Si bonds which results in desirably denser film. Herein, plasma treating the flowable a-Si layer is performed in the same processing chamber used to deposit the flowable a-Si layer resulting in reduced total substrate processing time, and individual substrate processing operations, when compared to other curing methods, such as UV curing, which requires a separate processing chamber and separate substrate processing operation.

Figure 1:
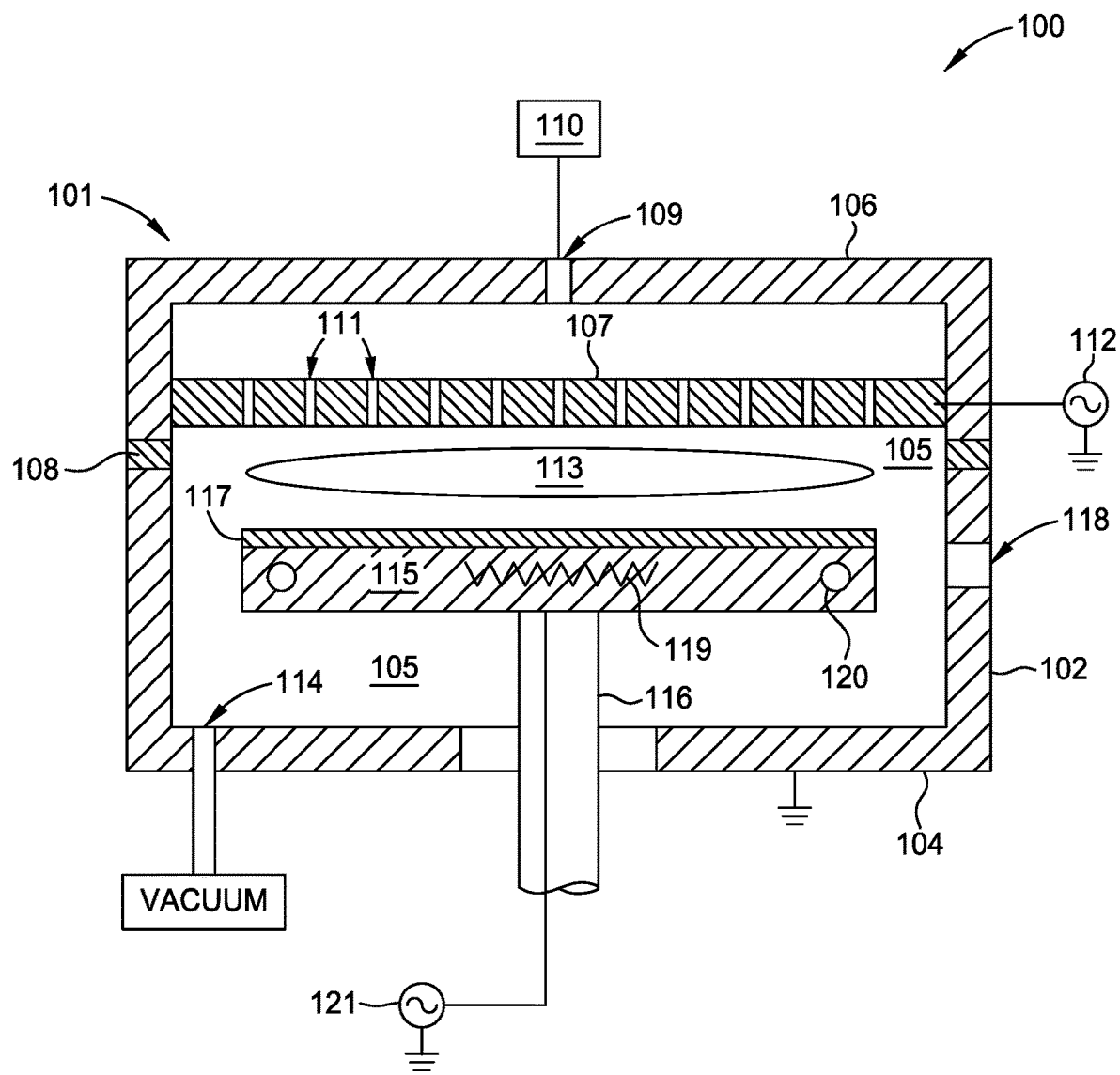
FIG. 1 is a schematic cross sectional view of an exemplary processing chamber used to practice the methods set forth herein, according to one embodiment.

FIG. 1 is a schematic cross sectional view of an exemplary processing chamber used to practice the methods set forth herein, according to one embodiment. Other exemplary deposition chambers that may be used to practice the methods describe herein include a Producer® ETERNA CVD® system or an Ultima HDP CVD® system, both available from Applied Materials, Inc., of Santa Clara, California as well as suitable deposition chambers from other manufacturers.

The processing chamber 100 includes a chamber lid assembly 101, one or more sidewalls 102, and a chamber base 104. The chamber lid assembly 101 includes a chamber lid 106, a showerhead 107 disposed in the chamber lid 106, and an electrically insulating ring 108, disposed between the chamber lid 106 and the one or more sidewalls 102. The shower head 107, one or more sidewalls 102, and the chamber base 104 together define a processing volume 105. A gas inlet 109, disposed through the chamber lid 106 is fluidly coupled to a gas source 110. The showerhead 107, having a plurality of openings 111 disposed therethrough, is used to uniformly distribute processing gases from the gas source 110 into the processing volume 105. The showerhead 107 is electrically coupled to a first power supply 112, such as an RF power supply, which supplies power to ignite and maintain a plasma 113 of the processing gas through capacitive coupling therewith. Herein, the RF power has a frequency between about 400 kHz and about 40 MHz, for example about 400 kHz or about 13.56 MHz. In other embodiments, the processing chamber 100 comprises an inductive plasma generator and the plasma is formed through inductively coupling an RF power to the processing gas.

The processing volume 105 is fluidly coupled to a vacuum source, such as to one or more dedicated vacuum pumps, through a vacuum outlet 114, which maintains the processing volume 105 at sub-atmospheric conditions and evacuates the processing gas and other gases therefrom. A substrate support 115, disposed in the processing volume 105, is disposed on a movable support shaft 116 sealingly extending through the chamber base 104, such as being surrounded by bellows (not shown) in the region below the chamber base 104. Herein, the processing chamber 100 is conventionally configured to facilitate transferring of a substrate 116 to and from the substrate support 115 through an opening 118 in one of the one or more sidewalls 102, which is conventionally sealed with a door or a valve (not shown) during substrate processing.

Herein, a substrate 117, disposed on the substrate support 115, is maintained at a desired processing temperature using one or both of a heater, such as a resistive heating element 119, and one or more cooling channels 120 disposed in the substrate support 115. Typically, the one or more cooling channels 120 are fluidly coupled to a coolant source (not shown), such as a modified water source having relatively high electrical resistance or a refrigerant source. In some embodiments, the substrate support 115 or one or more electrodes thereof (not shown) is electrically coupled to a second power supply 121, such as a continuous wave (CW) RF power supply or a pulsed RF power supply, which supplies a bias voltage thereto.

Figure 2:
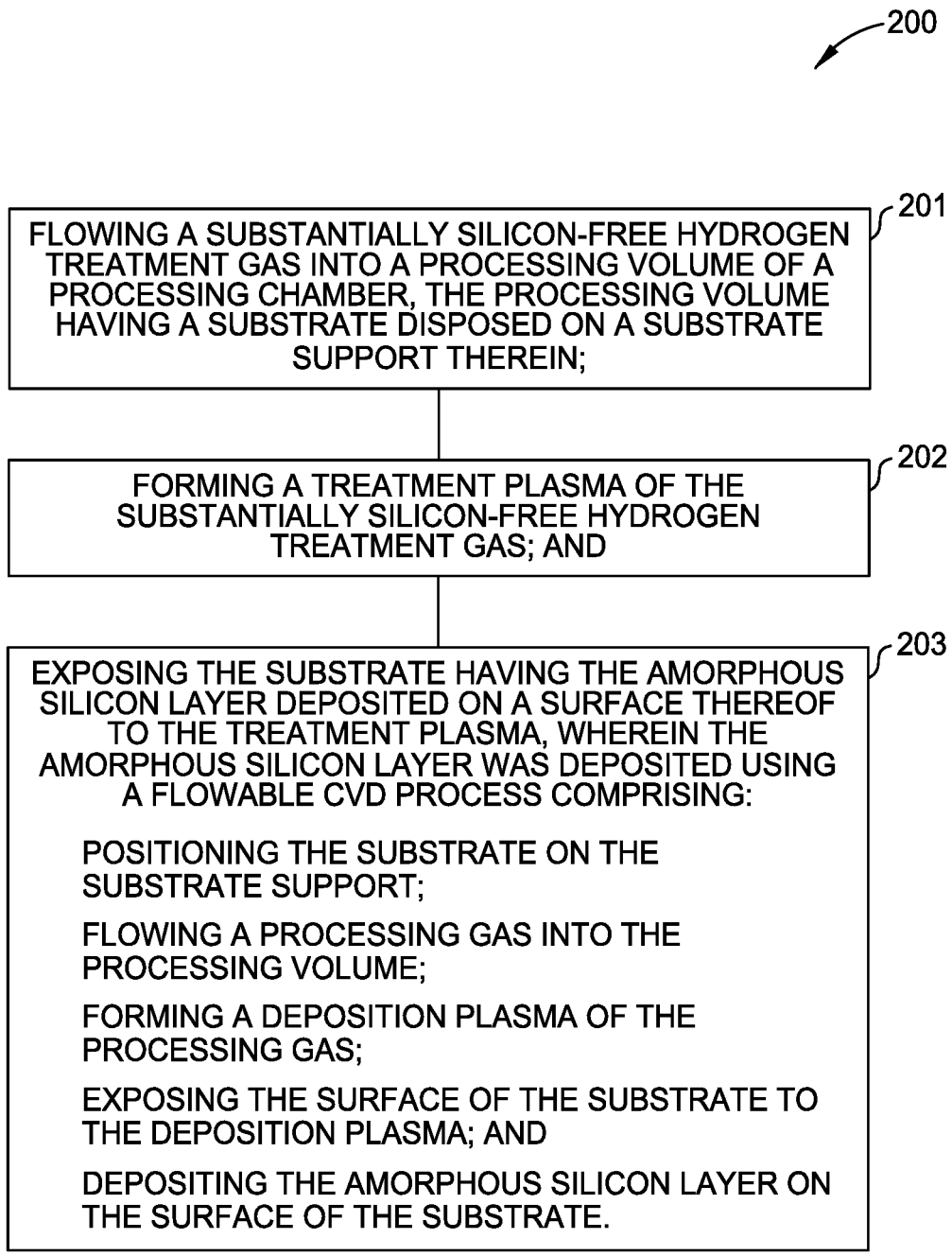
FIG. 2 is a flow diagram of a method of plasma treating an amorphous silicon layer, according to one embodiment.

FIG. 2 is a flow diagram of a method of plasma treating a flowable a-Si layer, according to one embodiment. At activity 201 the method 200 includes flowing a substantially silicon-free hydrogen treatment gas into a processing volume of a processing chamber. Herein, a substrate having an a-Si layer thereon formed by a flowable CVD process is disposed on a substrate support disposed in the processing volume. Typically, the hydrogen treatment gas comprises a hydrogen source gas, such as $H_2$, $NH_3$, or combinations thereof and one or more inert diluent gases, such as He, Ar, Kr, $N_2$, or combinations thereof, for example Ar. Typically, a ratio of hydrogen source gas to inert diluent gas is between about 1:10 and about 5:1, for example, in one embodiment a ratio of $H_2$ to Ar is between about 1:10 and about 2:1. In some embodiments, the hydrogen treatment gas is one of, or a combination of, substantially silicon-free, substantially oxygen-free, and substantially nitrogen-free gases, which means that gases forming the hydrogen treatment gas do not have a silicon, oxygen, and nitrogen moiety respectively. In some embodiments, the substrate is desirably maintained at a temperature between about −100° C. and about 100° C., between about −100° C. and about 75° C., between about −100° C. and about 75° C., for example between about −100° C. and about 50° C., or less than about 100° C., such as less than about 50° C., At activity 202 the method 200 includes forming a treatment plasma of the hydrogen treatment gas. Herein, forming the treatment plasma comprises igniting and maintaining a plasma of the hydrogen treatment gas through capacitive coupling with the showerhead powered by an RF or other ac frequency power source. In other embodiments, the treatment plasma is formed through inductive coupling with an inductively coupled plasma (ICP) generator such as a coil surrounding or covering at least a portion of the processing volume coupled to an rf or other ac frequency power source. Herein, the treatment plasma is an in-situ plasma, i.e., one formed between the substrate disposed on the substrate support and the showerhead. In some embodiments, the RF or other ac frequency power is between about 100 W and about 500 W, or less than about 500 W. In some embodiments, a pressure of the processing volume is desirably maintained at between about 1 mTorr and about 2 Torr during plasma treating the a-Si layer.

At activity 203 the method 200 includes exposing the substrate having the a-Si layer deposited on a surface thereof to the treatment plasma. Typically, the substrate support is in a raised substrate processing position, herein a first substrate processing position, during plasma treatment of the substrate. In the first substrate processing position, the surface of the substrate is spaced apart from the substrate facing surface of the showerhead by distance of more than 10 mm, such as more than about 20 mm, or between about 10 mm and about 300 mm, such as between about 20 mm and about 300 mm, between about 50 mm and about 300 mm, or for example between about 20 mm and about 100 mm, between about 100 mm and about 200 mm, or between about 200 mm and about 300 mm.

Herein, plasma treating the a-Si layer includes exposing the substrate to the treatment plasma for a duration of more than about 10 seconds, for example between about 10 seconds and about 60 seconds. Herein, the a-Si layer was deposited using an FCVD process which includes positioning the substrate on a substrate support disposed in the processing volume, flowing a processing gas into the processing volume, forming a deposition plasma of the processing gas, exposing the surface of the substrate to the deposition plasma, and depositing the a-Si layer on the surface of the substrate. Typically, the substrate support was in a second substrate processing position during the deposition of the a-Si layer. In the second substrate processing position the substrate was spaced apart from the substrate facing surface of the showerhead by a distance of less than about 20 mm, such as between about 5 mm and about 20 mm, for example between about 7 mm and about 18 mm. In some embodiments, the method 200 includes depositing the a-Si layer using the FCVD process. In some embodiments, the method 200 includes moving the substrate from the second processing position to the first processing position by lowering the substrate support between the plasma treatment and a-Si FCVD processes.

Herein, the processing gas comprises one or more silicon precursors, such as silane ($SiH_4$), disilane ($Si_2H_6$), trisilane ($Si_3H_8$), and tetrasilane ($Si_4H_{10}$), neopentasilane (NPS), cyclohexasilanes, or combinations thereof. In some embodiments, the silicon precursor is substantially carbon-free, where substantially carbon-free means that the silicon precursor does not have a carbon moiety therein. In some embodiments, the processing gas is one or more of substantially carbon-free, substantially-oxygen free, and substantially nitrogen-free.

In some embodiments, the substrate is a patterned substrate having a plurality of features formed on the surface thereof. In some embodiments, the patterned substrate has a plurality of openings formed in the surface thereof and depositing the a-Si layer on the surface of the substrate includes depositing the a-Si layer in the plurality of openings. In some embodiments, the plurality of openings have an aspect ratio (depth to width ratio) of more than 2:1, such as more than 5:1, more than 10:1, more than 20:1, for example more than 25:1. In some embodiments the width of the openings is less than about 90 nm, such as less than about 65 nm, less than about 45 nm, less than about 32 nm, less than about 22 nm, for example less than about 16 nm, or between about 16 nm and about 90 nm.

Typically, the substrate is formed from any materials and material layers suitable for use in an electronic device manufacturing process, such as silicon, silicon oxide, strained silicon, silicon on insulator (SOI), carbon doped silicon oxides, a-Si, doped silicon, germanium, gallium arsenide, glass, sapphire, metals, metal nitrides, metal alloys, and combinations thereof.

Herein, forming the deposition plasma includes capacitively coupling with the showerhead having an RF or other ac frequency power of less than about 1 W/cm$^2$ (of the substrate surface to be treated) imposed on the showerhead, such as less than about 0.7 W/cm$^2$, less than about 0.5 W/cm$^2$, less than about 0.3 W/cm$^2$, less than about 0.15 W/cm$^2$, less about 0.1 W/cm$^2$, for example less than about 0.05 W/cm$^2$. For example, for a substrate having a diameter of about 300 mm the RF imposed on the showerhead is less than about 300 W, such as less than about 250 W, less than about 200 W, less than about 150 W, less than about 100 W, less about 50 W, for example less than about 25 W. In some embodiments, the FCVD process includes providing a bias power to the substrate support where the bias power is a continuous RF power between about 20 W and about 500 W for a 300 mm diameter substrate. In other embodiments, the bias power is a pulsed RF power between about 20 W and about 500 W, having a pulse frequency of between about 1 Hz and about 1000 Hz and an on time duty of about 10-95%. In other embodiments, the bias power is a pulsed DC power.

In some embodiments, the processing gas further comprises a carrier gas or diluent gas, such as He, Ar, $H_2$, Kr, $N_2$, $NH_3$ or combinations thereof. Typically, during the FCVD process the pressure of the processing volume is desirably maintained at between about 10 mTorr and about 10 Torr, such as less than about 6 Torr, such as less than about 5 Torr, or between about 0.1 Torr and about 4 Torr, such as between about 0.5 Torr and about 3 Torr. Typically, the substrate is maintained at the same temperature or within the same range of temperatures during the FCVD and plasma treatment processes.

In some embodiments, the method includes purging the processing volume of processing gas before plasma treating the a-Si layer. Typically, purging the processing volume of processing gas and processing gas byproducts includes stopping the flow of the processing gas, extinguishing the deposition plasma, flowing a purge gas into the processing volume, and evacuating the purge gas from the processing volume before plasma treating the amorphous silicon layer. Typically, the purge gas comprises an inert gas such as He, Ar, Kr, $N_2$, or combinations thereof, for example Ar. In some embodiments, purging the processing volume comprises flowing the purge gas and evacuating the purge gas for a duration of between about 5 seconds and about 60 seconds.

The FCVD and post treatment process described above desirably provides a flowable a-Si film that enables seam free formation of features on the substrate surface and the bottom up, void free, filling of high aspect ratio openings formed in the surface of the substrate, such as openings having a width less than 90 nm and an aspect ratio of more than about 10:1. Plasma treatment of flowable a-Si layers reduces the hydrogen content in the flowable a-Si layer and increases the number of Si—Si bonds therein which results in a desirably denser film. In some embodiments, the pre-plasma treatment hydrogen content of an a-Si layer deposited using the FCVD methods described herein is more than about 30 at. % and the post-plasma treatment hydrogen content is less than about 20 at. %. Further, the plasma treatment methods herein result in less film shrinkage when compared to other curing methods, such as UV curing. In some embodiments, shrinkage of a flowable a-Si film using the plasma treatment methods provided herein is less than about 50%, such as less than about 40%, for example less than about 30%. In some embodiments, the plasma treated a-Si layers formed herein have a refractive index of not less than about 4.1, such as not less than about 4, or not less than about 3.9, for example not less than about 3.8, where a higher refractive indexes are indicative of increased film quality.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
depositing an amorphous silicon layer on the surface of the substrate using a flowable chemical vapor deposition (FCVD) process, comprising:
positioning a substrate on a substrate support disposed in a processing volume of a processing chamber;
flowing a processing gas into the processing volume;
forming a deposition plasma of the processing gas;
exposing the surface of the substrate to the deposition plasma; and
depositing the amorphous silicon layer on the surface of the substrate; then
purging the processing volume, comprising:
stopping the flow of the processing gas;
extinguishing the deposition plasma; and then
plasma treating the amorphous silicon layer, comprising:
flowing a substantially silicon-free hydrogen treatment gas into a processing volume;
forming a treatment plasma of the substantially silicon-free hydrogen treatment gas by capacitively coupling the treatment gas with an electrode at an RF power between about 100 W and about 500 W;
exposing the amorphous silicon layer to the treatment plasma; and
maintaining the substrate at a temperature between about −100° C. and about 100° C. during the exposing the amorphous silicon layer to the treatment plasma.

2. The method of claim 1, wherein the treatment plasma is formed by capacitively coupling the substantially silicon-free treatment gas with an electrode at an RF power between about 0.10 W/cm² of substrate surface area and about 1 W/cm².

3. The method of claim 1, wherein plasma treating the amorphous silicon layer comprises maintaining the processing volume at a pressure between about 1 mTorr and about 2 Torr.

4. The method of claim 1, wherein the hydrogen treatment gas is substantially silicon-free and substantially oxygen-free.

5. The method of claim 1, wherein the substantially silicon-free hydrogen treatment gas comprises $H_2$ and an inert gas.

6. The method of claim 5, wherein a ratio of $H_2$ to inert gas is between about 1:10 and about 5:1.

7. The method of claim 5 wherein the inert gas is Ar.

8. The method of claim 1, wherein plasma treating the amorphous silicon layer comprises exposing the substrate to the treatment plasma for more than about 10 seconds.

9. The method of claim 1, wherein the processing gas comprises one or more silicon precursors selected from the group consisting of silane ($SiH_4$), disilane ($Si_2H_6$), trisilane ($Si_3H_8$), and tetrasilane ($Si_4H_{10}$), neopentasilane (NPS), and cyclohexasilanes.

10. The method of claim 9, wherein the processing gas is one or both of substantially nitrogen-free and substantially oxygen-free.

11. The method of claim 1, wherein the plasma treated amorphous silicon layer has a refractive index of not less than about 4.1.

12. The method of claim 1, further comprising a plurality of sequential cycles of depositing the amorphous silicon layer and plasma treating the amorphous silicon layer.

13. A method of processing a substrate, comprising:
depositing an amorphous silicon layer, comprising:
positioning the substrate on a substrate support disposed in a processing volume;
flowing a processing gas into the processing volume, wherein the processing gas is substantially oxygen-free and substantially nitrogen-free;
forming a deposition plasma of the processing gas by capacitively coupling the processing gas with an electrode at an RF or other ac frequency power of less than about 300 W;
exposing the surface of the substrate to the deposition plasma; and
depositing the amorphous silicon layer on a surface of the substrate; then
purging the processing volume, comprising:
stopping the flow of the processing gas;
extinguishing the deposition plasma;
flowing a purge gas into the processing volume; and
evacuating the purge gas from the processing volume before plasma treating the amorphous silicon layer;
and then plasma treating the amorphous silicon layer, comprising:
flowing a treatment gas into the processing volume, wherein the treatment gas comprises $H_2$ and an inert gas in a ratio between about 1:10 and about 5:1, and wherein the treatment gas is substantially silicon-free and substantially oxygen-free;

forming a treatment plasma of the treatment gas by capacitively coupling the treatment gas with an electrode at an RF power between about 100 W and about 500 W;

exposing the amorphous silicon layer to the treatment plasma for a duration of more than about 10 seconds; and maintaining the substrate at a temperature between about −100° C. and about 100° C. during the exposing the amorphous silicon layer to the treatment plasma.

14. The method of claim 13, wherein depositing the amorphous silicon layer further comprises maintaining the processing volume at a pressure between about 10 mTorr and about 10 Torr.

15. The method of claim 13, wherein the plasma treated amorphous silicon layer has a refractive index of not less than about 4.1.

16. The method of claim 13, further comprising a plurality of sequential cycles of depositing the amorphous silicon layer and plasma treating the amorphous silicon layer.

17. The method of claim 16, wherein forming the deposition plasma comprises applying an RF or other ac frequency power of less than about 300 W to a showerhead disposed in the processing volume.

18. A method of processing a substrate, comprising:

depositing an amorphous silicon layer, comprising:

positioning a substrate on a substrate support disposed in a processing volume;

flowing a processing gas into the processing volume, wherein the processing gas is substantially oxygen-free and substantially nitrogen-free;

forming a deposition plasma of the processing gas by capacitively coupling the processing gas with an electrode at an RF or other ac frequency power of less than about 300 W;

exposing the surface of the substrate to the deposition plasma; and depositing the amorphous silicon layer on a surface of the substrate; then purging the processing volume, comprising:

stopping the flow of the processing gas;

extinguishing the deposition plasma;

flowing a purge gas into the processing volume; and evacuating the purge gas from the processing volume before plasma treating the amorphous silicon layer; and then plasma treating the amorphous silicon layer, comprising:

flowing a treatment gas into the processing volume, wherein the treatment gas comprises $H_2$ and an inert gas in a ratio between about 1:10 and about 5:1, and wherein the treatment gas is substantially silicon-free and substantially oxygen-free;

forming a treatment plasma of the treatment gas by capacitively coupling to an electrode at an RF or other ac frequency power between about 100 W and about 500 W;

exposing the amorphous silicon layer to the treatment plasma for a duration of more than about 10 seconds; and then maintaining the substrate at a temperature between about −100° C. and about 100° C. during the exposing the amorphous silicon layer to the treatment plasma.

19. The method of claim 18, wherein the plasma treated amorphous silicon layer has a refractive index of not less than about 4.1.

* * * * *